(12) United States Patent
Ku et al.

(10) Patent No.: US 6,251,724 B1
(45) Date of Patent: Jun. 26, 2001

(54) METHOD TO INCREASE THE CLEAR RATION OF CAPACITOR SILICON NITRIDE TO IMPROVE THE THRESHOLD VOLTAGE UNIFORMITY

(75) Inventors: Shu-Mei Ku, Taipei County; Lin-June Wu, Hsinchu, both of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/431,235

(22) Filed: Nov. 1, 1999

(51) Int. Cl.$^7$ ................................................ H01L 21/8242
(52) U.S. Cl. ............................................ 438/253; 438/763
(58) Field of Search ........................................ 438/239, 253, 438/289, 396, 762, 763

(56) References Cited

U.S. PATENT DOCUMENTS

| | | | |
|---|---|---|---|
| 4,922,312 | 5/1990 | Coleman et al. | 357/23.6 |
| 5,098,192 | 3/1992 | Coleman et al. | 357/23.6 |
| 5,244,825 | 9/1993 | Coleman et al. | 437/52 |
| 5,624,864 | * 4/1997 | Arita et al. | 438/763 |
| 5,658,821 | 8/1997 | Chen et al. | 438/396 |
| 5,913,121 | * 6/1999 | Kasai | 438/763 |

* cited by examiner

*Primary Examiner*—Chandra Chaudhari
(74) *Attorney, Agent, or Firm*—George O. Saile; Stephen B. Ackerman; William J. Stoffel

(57) ABSTRACT

A method to remove the silicon nitride capacitor dielectric layer from over the poly-1 layer on portions of the wafer including non-capacitor areas such as the pad contact area, process control monitor (PCM) testsite areas and scribe line areas. By removing the silicon nitride, $H_2$ can penetrate to the polysilicon and thereby increase the uniformity of the VT. In a first embodiment of the invention, the silicon nitride capacitor dielectric layer is etched away from over the poly-1 layer in the pad area. The removal of the SiN layer allows $H_2$ to penetrate into the poly-1 layer and improve the threshold voltage (VT). Uniformity of long channel VT-N was improved when we modify the pad struture of PCM to increase the clear out ratio of capacitor $Si_3N_4$ to 1.0584%. In a second embodiment of the invention, the silicon nitride capacitor dielectric is etched away from over the poly-1 layer in the process control monitor (PCM) testsite area between the chips. In a third embodiment of the invention, the silicon nitride capacitor dielectric is etched away from over the poly-1 layer in the scribe area between the between the chips.

10 Claims, 7 Drawing Sheets

METHOD TO INCREASE THE CLEAR RATION OF CAPACITOR SILICON NITRIDE TO IMPROVE THE THRESHOLD VOLTAGE UNIFORMITY

BACKGROUND OF INVENTION

1. Field of the Invention

This invention relates generally to fabrication of capacitors for semiconductor devices and more particularly to the fabrication of a capacitors and pad contacts for an analog integrated circuit device.

2. Description of the Prior Art

In the fabrication of combined analog and digital integrated circuits it is common to form capacitors over field oxide regions and form MOS FET near by. For the inventors to improve the capacitor performance, higher dielectric constant capacitor SiN (silicon nitride) is deposited over the bottom storage electrode (poly-1) layer and before the interlevel dielectric (ILD).

The inventors have found that the SiN over the polysilicon bottom plate causes Threshold voltage (Vt) uniformity problems.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,658,821 (Chen et al.) Method of improving uniformity of metal-to-poly capacitors composed by polysilicon oxide and avoiding device damage—that discloses a method for the formation of capacitors comprising a polysilicon first capacitor plate, polysilicon oxide dielectric, and a metal second capacitor plate which improves uniformity of capacitance and avoids device damage. More particularly the patent discloses conditioning the polysilicon first capacitor plate by forming a thin layer of polysilicon oxide on the polysilicon followed by removal of the polysilicon oxide using a buffered oxide etch or a dry anisotropic etch. A first layer of polysilicon oxide is formed on a polysilicon first capacitor plate. The wafer is then dipped in a buffered oxide etch or subjected to a dry anisotropic etch. The etching conditions the polysilicon layer so that subsequent polysilicon oxide growth is very uniform and controllable. A second polysilicon oxide layer is then formed on the polysilicon first capacitor plate. A layer of silicon nitride is formed on the polysilicon oxide and a second capacitor plate is formed on the layer of silicon nitride completing the capacitor. Improved capacitance uniformity across the wafer is achieved and device damage is avoided.

U.S. Pat. No. 4,922,312 (Coleman et al.) DRAM process with improved polysilicon-to-polysilicon capacitor and the capacitor and U.S. Pat. No. 5,098,192 (Colemen et al.) and U.S. Pat. No. 5,244,825(U.S. Pat. No. 5,098,192 (Colemen et al.)—teach methods for fabrication of DRAM cells having an upper capacitor plate over the polysilicon storage gate. To provide a very high specific capacitance and very good integrity between the first polysilicon storage gate and the (second or third polysilicon) upper capacitor plate, the dielectric is formed as an oxide/nitride composite which is then reoxidized. This provides the advantages of high dielectric integrity, high specific capacitance, uniformity and reproducibility.

However, further improvements can be made to improve the VT uniformity.

SUMMARY OF THE INVENTION

It is an object of the present invention to provide a method for fabricating a analog capacitor which has more uniform VT.

It is an object of the present invention to provide a method for fabricating a pad contact and a capacitor where the SiN over the poly-1 in the pad contact is removed to make She VT more uniform.

It is an object of the present invention to provide a method for fabricating a scribe area and a capacitor where the SiN over the poly-1 in the scribe area is removed to make the VT more uniform.

It is an object of the present invention to provide a method for fabricating a process control monitor (PCM) testsite and a capacitor where the SiN over the poly-1 in the process control monitor (PCM) is removed to make the VT more uniform.

To accomplish the above objectives, the present invention provides a method of manufacturing a capacitor for an analog IC which is characterized as follows.

In a first embodiment of the invention, the silicon nitride capacitor dielectric layer 28 is etched away from over the poly-1 layer 18C in the pad area 8. The removal of the SiN layer 18C allows $H_2$ to penetrate into the poly-1 layer 18C and improve the VT.

The inventors have found that threshold voltage (Vt or VT) uniformity is improved when the clear out ratio (area of SiN removed/total area of SiN on whole wafer) is between 1.0584% and 99% and more preferably greater than 1.06%. Uniformity of long channel VT-N was improved when we modify the pad structure of PCM to increase the clear out ratio of capacitor $Si_3N_4$ to 1.0584%.

In a second embodiment of the invention, the silicon nitride capacitor dielectric is etched away from over the poly-1 layer 18C in the pad areas 137 in the process control monitor (PCM) testsite areas 135 between the chips 100.

In a third embodiment of the invention, the silicon nitride capacitor dielectric is etched away from over the poly-1 layer 18C in the scribe area 130 131 between the between the chips 100.

The invention can comprise: providing a substrate having devices formed therein; the substrate having device areas and pad areas We providing field oxide isolation regions in the silicon substrate. providing contact regions on the substrate. forming a first polysilicon layer over the substrate. Then the first polysilicon layer is patterned to define first polysilicon capacitor plates on the field oxide isolation regions. and gate electrodes over the substrate. and polysilicon pads over the pad area.

We form a IPO layer of insulator dielectric over the substrate covering the first polysilicon capacitor plates and gate electrodes and polysilicon pads. Next, a silicon nitride layer is formed over the PO layer and an ELD layer is formed over the silicon nitride layer. Next, a contact etch is performed by patterning the ILD layer to define a contact opening exposing the contact region in the device area.

We then perform a capacitor/pad opening etch by etching the ILD layer to form a capacitor opening over the first polysilicon capacitor plates and to form a pad opening over the pad area. Next, in a key step we perform a pad etch to remove the nitride layer and the IPO layer over the polysilicon pads in the pad areas.

In a preferred embodiment the invention further includes forming top polysilicon plate over the first polysilicon capacitor plates, and forming a Pad metal in the pad area.

In a preferred embodiment the invention the pad area is within a testsite area in a scribe area between chip areas.

In a preferred embodiment the invention the pad area is within a testsite pad area. In a preferred embodiment the invention the pad area is within a chip area in the device area.

In a preferred embodiment the invention further includes: the substrate having scribe areas between the device areas. the device areas are chip areas. The capacitor/pad opening etch removes the ILD layer from over the scribe areas. the pad etch to remove the nitride layer and the IPO layer over the scribe areas.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1 to 5 shows the first embodiment of the invention where the SiN layer is removed over the pad areas in the chip areas or test site pads.

DETAILED DESCRIPTION OF THE PREFERRED EMBODIMENTS

A. Problem Invention Solves

The inventors have found that leaving the silicon nitride covering the capacitors and other devices causes the (Threshold voltage ) VT_N20/20 (N channel device== width to length ratio 20 to 20) to vary within the wafer. Vt is measured on MOSFET devices on a test site on a scribe line.

The inventors surmise that the Poor uniformity of the long channel VT_N20/20 is due to the $H_2$ (from where the final alloy) is blocked by the silicon nitride (SiN) (capacitor dielectric layer 28). Extending alloy time and increasing the alloy temperatures can not completely improve the uniformity of long channel VT-N.

B. Invention—Remove SiN 28 over Poly Layer

A general purpose of the present invention is to remove the silicon nitride capacitor dielectric layer 28 from over the poly-1 layer (e.g., 18C) on portions of the wafer including non-capacitor areas such as the pad contact area, process control monitor (PCM) testsite areas and scribe line areas. By removing the silicon nitride 28, $H_2$ can penetrate to the polysilicon and thereby increase the uniformity of the VT.

II. First Embodiment—Pad Etch

Figure 3:
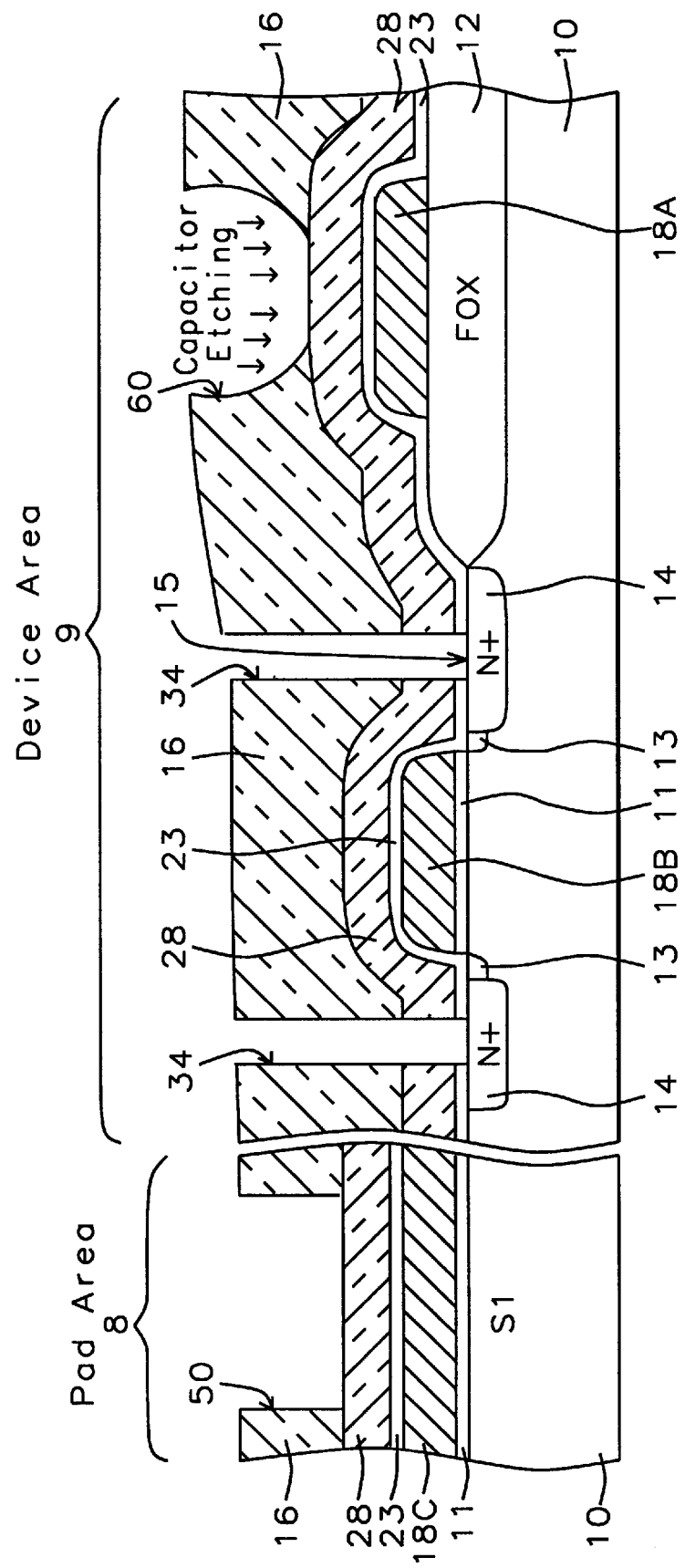
Figure 4:
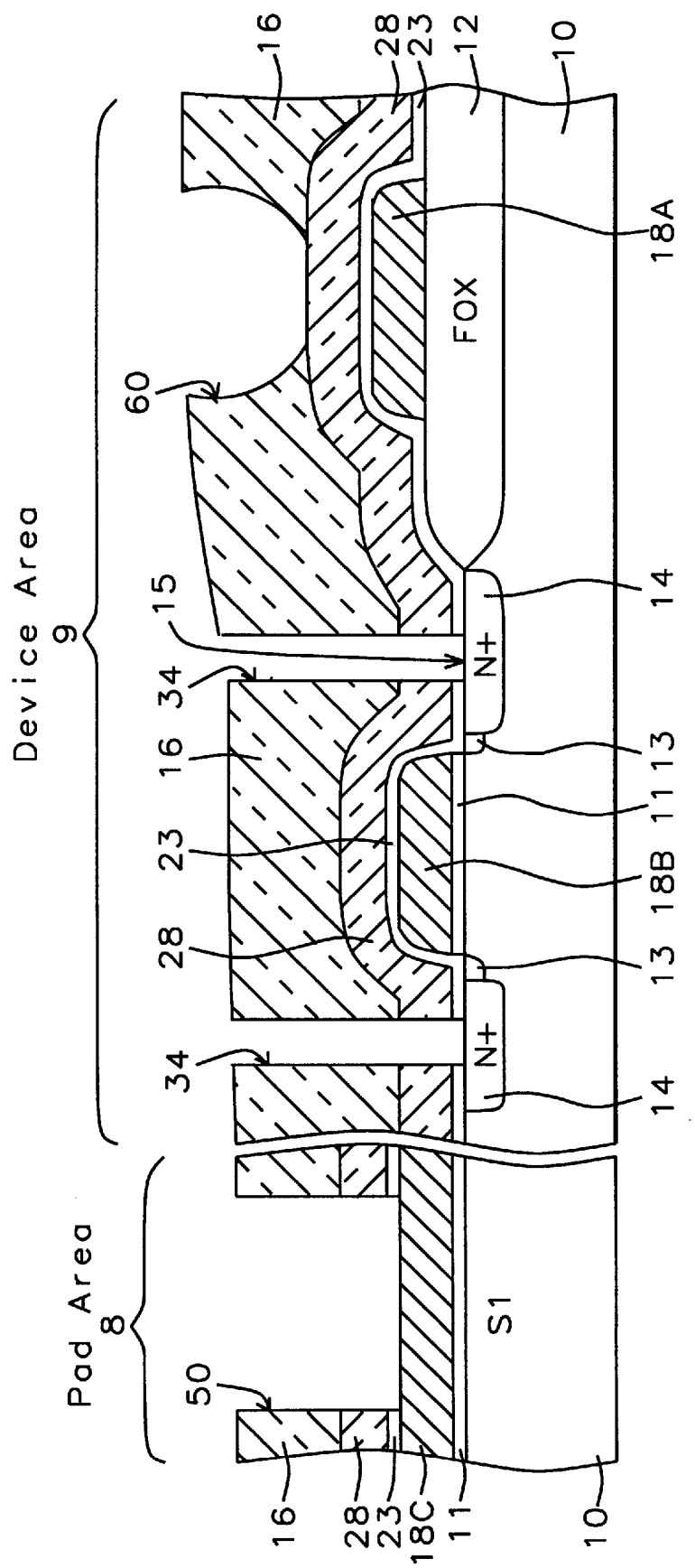
Figure 5:
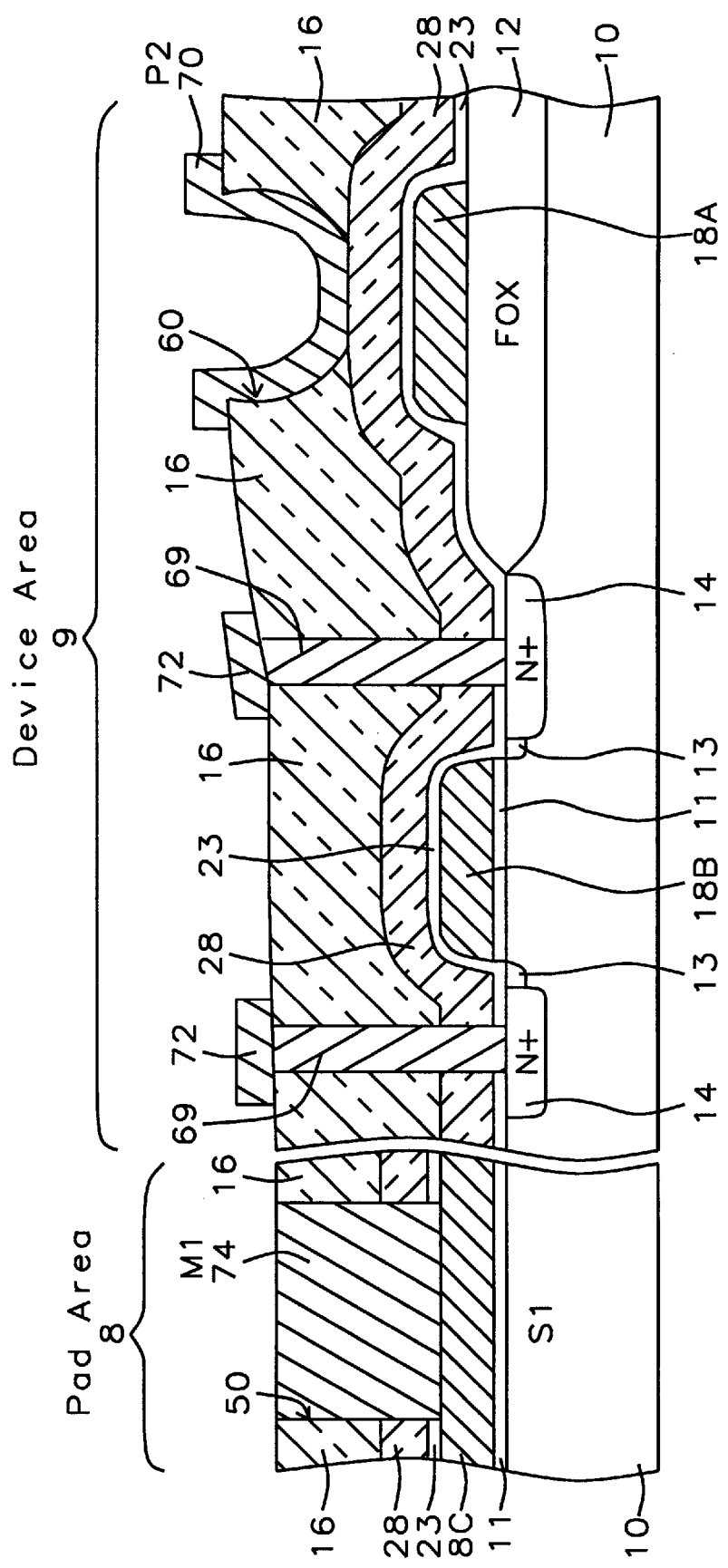
Figure 6:
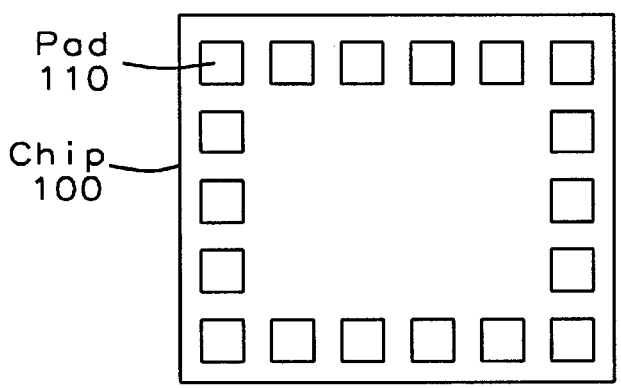
FIG. 6 is a top down view of a chip area 100 having pads 110.

The first preferred embodiment of the invention is shown in FIGS. 1 to 4. FIG. 5 shows a top down view of a chip 100 having contact pads 110 along the periphery.

Figure 1:
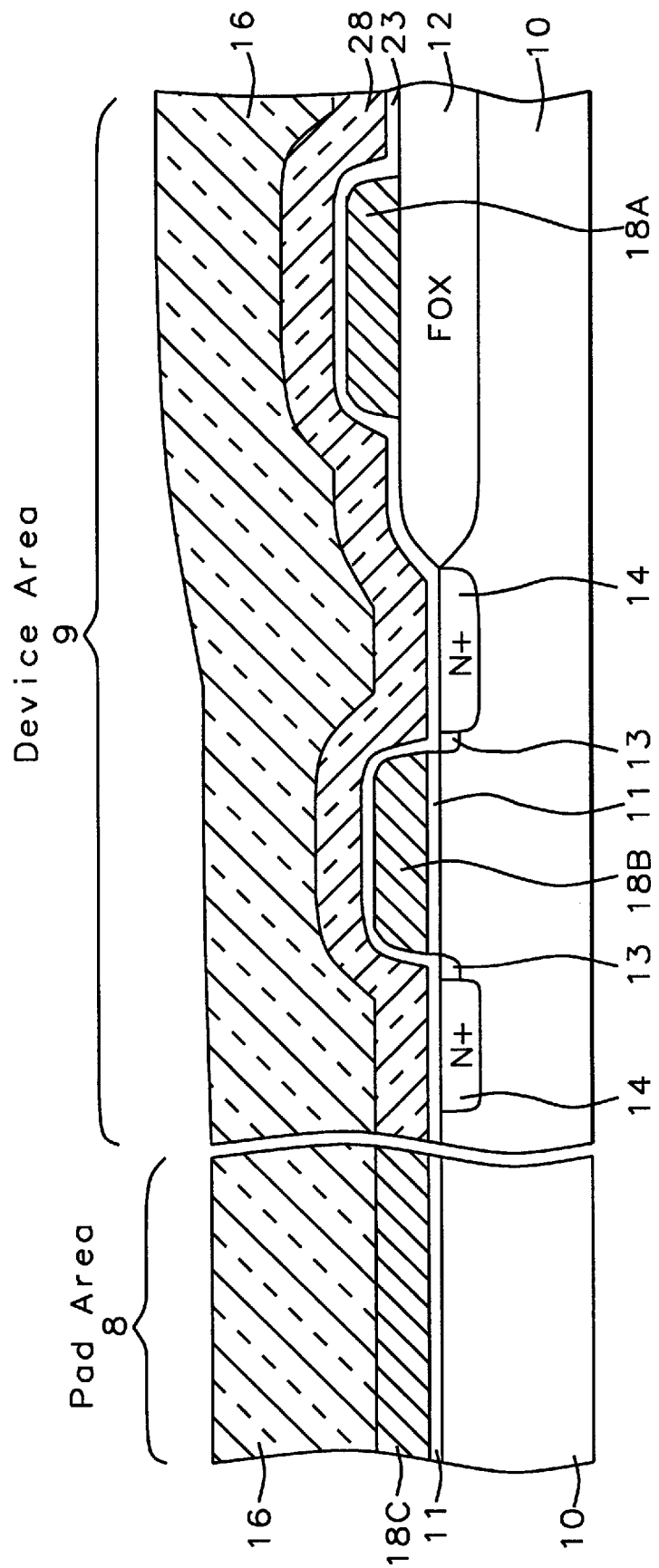
FIGS. 1 through 5 are cross sectional views for illustrating a method for manufacturing a capacitor where the SiN layer 28 is removed from over the polysilicon layer 18C in the pad area in a chip area 100, testsite pad area 137 and the scribe areas 131 according to the present invention.

FIG. 1 shows a substrate 10 having devices formed therein; the substrate having device 9 areas and pad areas 8. FIG. 1 shows a cross section view of a silicon integrated circuit wafer 10 with an electrical contact region 14 (e.g., source drain or doped region). It is important to note that the pad area 8 can represent the chip pads 110 (see FIG. 8) or the test site pads 137 (see FIG. 8). The devices area can be the chip areas 100.

In this case, one MOSFET having a gate dielectric layer 11, a gate electrode 18 B, source/drain regions 14 (contact regions 14) and one of the field oxide isolation regions 12 are shown.

Next, we form a first polysilicon layer over the substrate. Then we pattern the first polysilicon layer to define first polysilicon capacitor plates 18A on the field oxide isolation regions; and gate electrodes 18B over the substrate; and polysilicon pads 18C over the pad area 8. The polysilicon first capacitor plate 18 is formed on the field oxide isolation region 12. The electrical contact region 15 (see FIG. 2) is part of the source/drain region 14.

Next the method forms an inter-poly oxide (IPO) layer 23 of insulator dielectric over the substrate covering the first polysilicon capacitor plates and gate electrodes 18B and polysilicon pads 18C. The IPO layer is preferably comprised of oxide having a thickness of between about 100 and 250Å.

Then we form a silicon nitride layer 28 over the IPO layer. The Silicon nitride layer preferably has a thickness of between about 300 and 400 Å. The nitride layer functions as the capacitor dielectric between the bottom electrode and top cell plates. The SiN layer is preferably formed by the following process: LPCVD furnace. This is the SiN layer that is removed in later steps to improve the Threshold Voltage (Vt) uniformity.

An interlevel dielectric (ILD) layer 16 is then formed over the silicon nitride layer 28. The ILD layer is preferably composed of silicon oxide, doped silicon oxide or an low—k material and is most preferably composed of borophosphosilicate glass (BPSG). The interlevel dielectric layer preferably has a thickness of between about 5000 and 6000Å.

Figure 2:
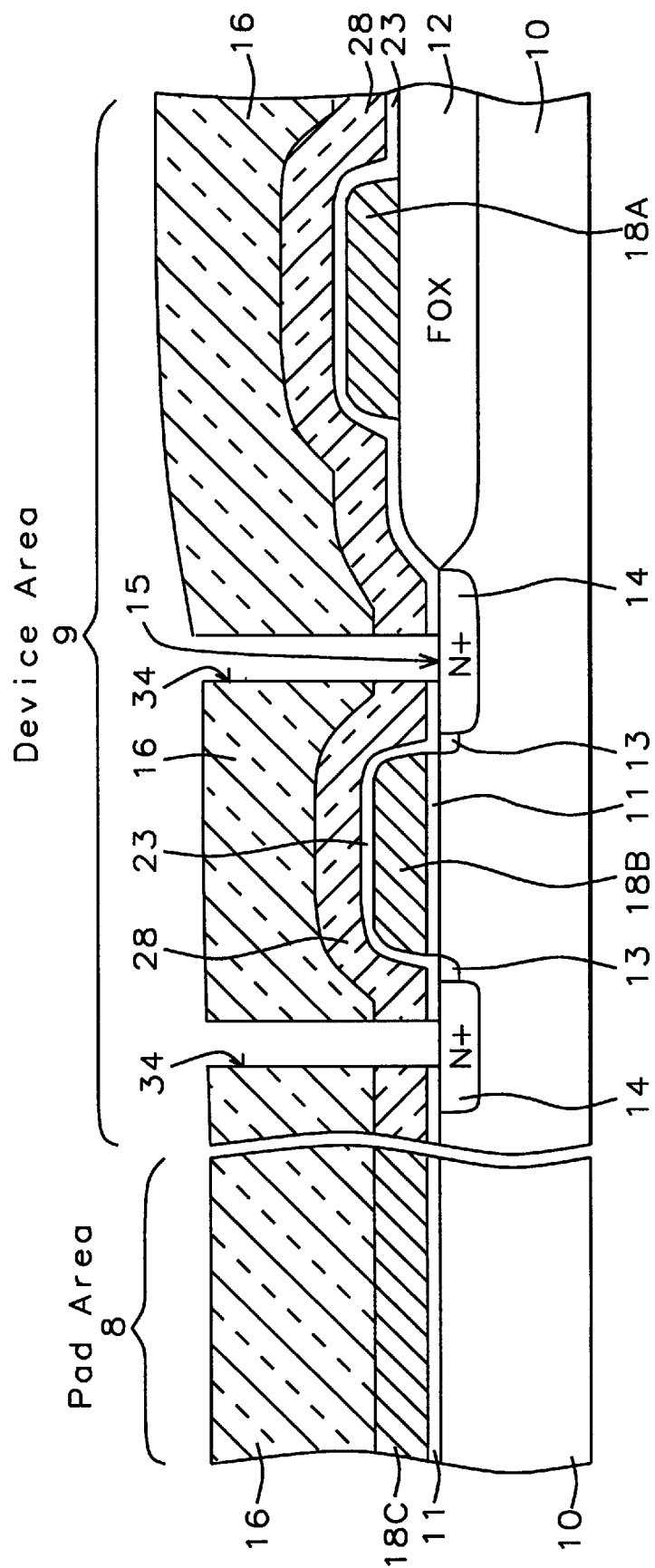

A. FIG. 2—Contact Etch

Referring to FIG. 2, we perform a contact etch by patterning the interlevel dielectric (ILD) layer 16 to define a contact opening 34 exposing the contact area 15 in the device area 9 in the pad area 8. A conventional photoresist patterning and etch process can be used.

B. FIG. 3—IDL Etch for Capacitor Top Plate and Pad Contact

As FIG. 3 show, we perform a capacitor/pad opening etch by etching the ILD layer to form a capacitor opening 60 over the first polysilicon capacitor plates and to form pad opening 50 over the pad area.

C. FIG. 4—Key Step of 1st Embodiment—remove SiN 22 From Over Pad Area 8

As shown in FIG. 4, in an important step, a pad etch is performed to remove the nitride layer 28 and the IPO layer 23 from over the polysilicon pads 18C in the pad area 8.

The pad etch is the key step because the pad etch removes the SiN layer 28 and IPO layer 23 from over the polysilicon 18C in the pad area. Importantly, the removal of this nitride layer in the pad areas improves VT by opening the pad area on the contact layer.

The VT is measured on the poly 18C the gate of a MOSFET in a test line on the scribe lane between chips.

D. FIG. 5—Completed Device

FIG. 5 shows a completed device with the capacitor with a top polysilicon plate (P2- poly 2). Contact plus 69 are formed. Capacitor top plate 70 and contacts 72 are formed. Pad metal (M1) 74 is then formed in the pad area.

Processing continues using conventional methods as inter metal dielectric (IMD) and metal layers are formed thereover to complete the devices.

E. Summary of 1st Embodiment

The first embodiment preferably comprises:

a) See FIG. 1—providing a substrate 10 having devices formed therein; the substrate having device 9 areas and pad areas 8; providing field oxide isolation regions 12 in the silicon substrate; providing contact regions 14 on the substrate 10;

b) forming a first polysilicon layer over the substrate;

c) patterning the first polysilicon layer to define first polysilicon capacitor plates 18A on the field oxide isolation regions; and gate electrodes 18B over the substrate; and polysilicon pads 18C over the pad area 8;

d) forming a IPO layer 23 of insulator dielectric over the substrate covering the first polysilicon capacitor plates and gate electrodes 18B and polysilicon pads 18C;

e) forming a silicon nitride layer 28 over the IPO layer;

f) forming an ILD layer 16 over the silicon nitride layer 28;

g) See FIG. 2—performing a contact etch by patterning the ILD layer 16 to define a contact opening 34 exposing the contact region 14 in the device area 9;

h) See FIG. 3—performing a capacitor/pad opening etch by etching the ILD layer to form a capacitor opening 60 over the first polysilicon capacitor plates and to form a pad opening 50 over the pad area 8;

i) FIG. 4—performing a pad etch to remove the nitride layer and the IPO layer over the polysilicon pads 18C in the pad areas; 2. forming top polysilicon plate (P2-poly 2) over the first polysilicon capacitor plates, and forming a Pad metal (M1) 74 in the pad area.

III. 2nd Embodiment—Remove SiN From Pad 137 in Testsites

Figure 8:
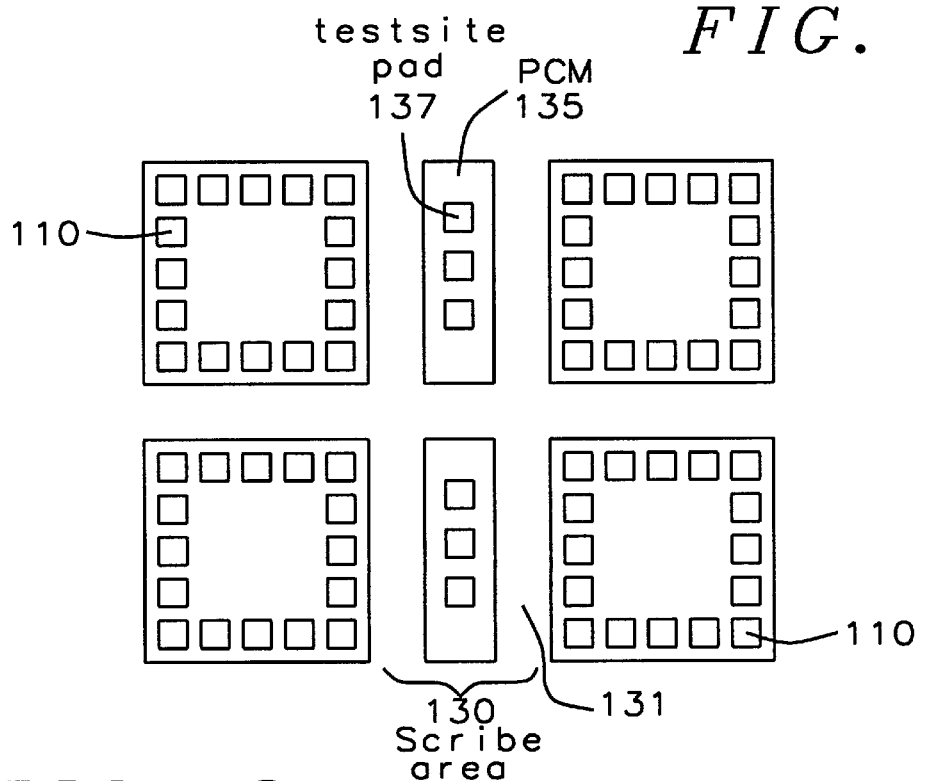
FIG. 8 is a top down view of a substrate having chip areas 100 scribe areas 130, Testsites 135, testsite pads 137 and non-testsite-scribe areas 131 according to the present invention where the SiN and ILD layers are removed from the testsite pads 137 and the areas 131 in the second and third embodiments of the invention.

The 2nd preferred embodiment of the invention removes the silicon nitride layer from over the pads in a testsite area (e.g., the PCM test site area). FIG. 8 shows a top down view of a wafer with chips 100 with scribe lines 130 between the chips. Process control monitor (PCM) testsites 135 are located between the chips. The testsite 135 had testsite pads 137. The SiN layer 28 from over the testsite pads is removed in the 2nd embodiment.

The process for removing the SiN layer over the pads in the PCM test site area is the same as describe above for the 1st embodiment for removing the SiN over the pads 18C. That is the pads in the PCM test site area (element 8 as shown in FIGS. 1 to 4) is represented by the pad area 8 shown in FIGS. 1 to 4. The invention removes the SiN in the pads 137 in PCM testsites and preferably from the whole scribe areas 131 outside of the PCM 135 (See FIG. 8). Area 131 represents the portions of the scribe line area 130 that does not contain any testsites.

The table below shows an example of the results for the 2nd embodiment of the invention.

TABLE 5

WAT data for modified pad structure on process control monitor (PCM)

| | Standard cell (Vt Mean/ Vr standard deviation) | New Pad structure on process control monitor (PCM) (Vt Mean/ Vr standard deviation) |
|---|---|---|
| VT N20/20 Long channel | Mean Vt = 0.746 / Std = 0.065 Poor | Mean Vt = 0.670/std deviation = .012 Good |
| VT N20/1 (Short channel) | Mean = 0.601 / STD DEV 0.016 = poor | Mean Vt = 0.572 / STD DEV = 0.009 = Good |
| Yield | 81.95% (poor) | 91.23% |

The VT N20/20 is the threshold voltage of a test FET with a 20/20 Width to length ratio of the long channel. The table above shows the 2nd embodiment that improves the VT because of the SiN removing area increased.

A. Summary of Second Embodiment

The second embodiment (remove SiN on testsite pads) can be summarized as comprising:

a) See FIG. 8 and FIG. 1—providing a substrate 10 having chip areas 100 and scribe areas 130; a testsite area 135 in the scribe areas 130; the testsite areas having testside pad areas 137; the chip areas 100 having pad areas 8;

b) providing field oxide isolation regions 12 in the substrate; providing contact regions 14 in the chip areas in the silicon substrate 10;

c) forming a first polysilicon layer over the substrate;

d) patterning the first polysilicon layer to define first polysilicon capacitor plates 18A on the field oxide isolation regions; and gate electrodes 18B over the substrate; and polysilicon pads 18C over the testsite area 137;

e) forming a IPO layer of insulator dielectric over the substrate covering the first polysilicon capacitor plates and gate electrodes 18B and polysilicon pads 18C;

f) forming a silicon nitride layer 28 over the IPO layer;

g) forming an interlevel dielectric (ILD) layer 16 over the silicon nitride layer 28;

h) FIG. 2—performing a contact etch by patterning the interlevel dielectric layer 16 to define a contact opening exposing the contact area 17 in the chip area 100;

i) FIG. 3—performing a testsite pad opening etch by etching the ILD layer to form a capacitor opening 60 over the first polysilicon capacitor plates and to form a testsite pad opening 50 over the testsite pad area 137;

j) FIG. 4—performing a pad etch to remove the nitride layer and the IPO layer over the polysilicon layer in the testsite pad area 137.

IV. Third Embodiment—Remove SiN 28 Over the Scribe Lines 130

Figure 7:
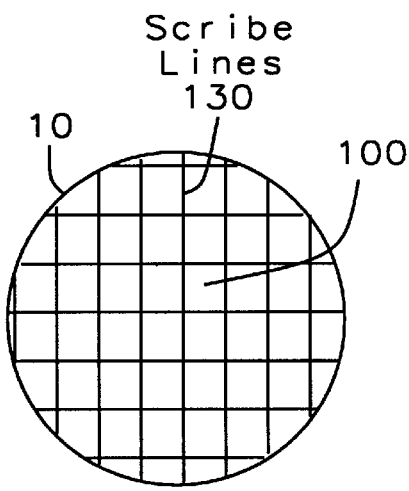
FIG. 7 is a top down view of a substrate 10 having chip areas 100 and scribe line areas 130 therebetween.

The third preferred embodiment of the invention removes the silicon nitride layer from over the scribe area. The third preferred embodiment most preferably removes the SiN layer and ILD layer from the entire scribe area 130. FIG. 7 shows a top plan view of a wafer 10 having chips 100 and scribe lines 130 between the chips 100.

Figure 9:
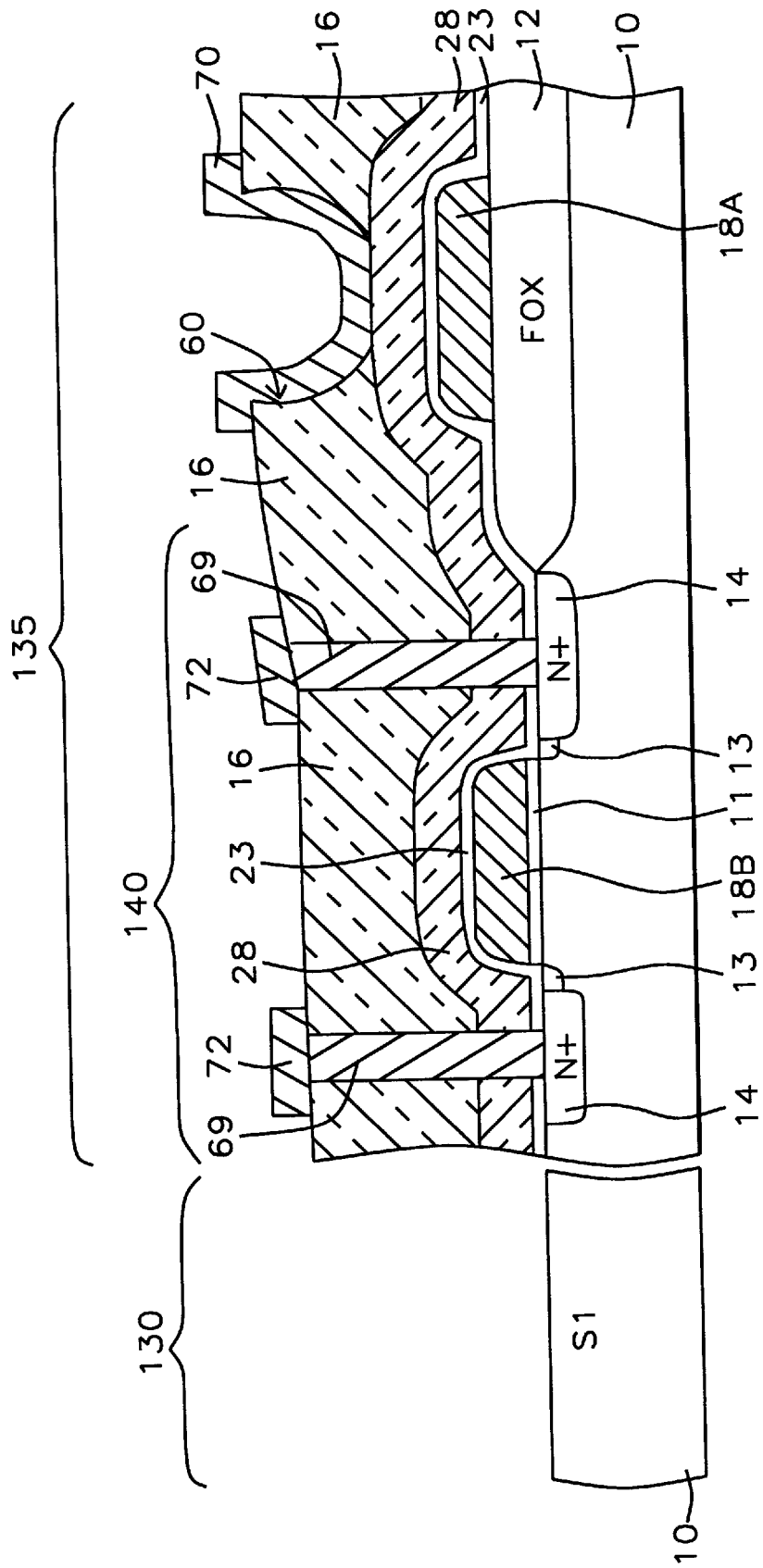
FIG. 9 is a cross sectional views for illustrating a method for manufacturing a capacitor where the SiN layer 28 and ILD layer 16 is removed from over the polysilicon layer 18C in the non-testsite-scribe areas 131 according to the $3^{rd}$ embodiment of the present invention.

FIG. 9 shows a cross sectional view with the ILD 16 and SIN layers 28 removed from the scribe area 130. The PCM testsite area 135 is shown with an example of a MOSFET 140 which is used to test the threshold voltage (VT).

A dark tone scribe area has the interlevel dielectric (ILD) layer and SiN layer remaining during the contact etch. The invention's clear tone scribe area has the interlevel dielectric (ILD) 16 and the SiN layer 28 etched away during the contact etch (as described above for the first embodiment). The process for removing the SiN layer over the scribe area is the same as described above for the $1^{st}$ embodiment. That is the scribe area 8 is represented by the pad area 8 shown in FIGS. 1 to 4.

The table below show the results of the $3^{rd}$ embodiment of the invention.

The clear out ratio is the % area of SiN removed/total wafer area (2Π wafer radius).

TABLE 2

The clear out ratio of difference mask

| Clear out ratio | TM4331 | TM2737 |
|---|---|---|
| Contact mask with dark scribe lane tone | 0.7216% dark tone of scribe lane - poor uniformity | 6.3031% (CLEAR tone of scribe lane - good uniformity) ($3^{rd}$ embodiment of the invention) |
| Contact mask with clear scribe lane tone | 6.6532% (Clear tone of scribe lane) - good | 11.5953% (new pad structure in testsites ($2^{nd}$ embodiment and the $3^{rd}$ embodiment (No ILD and SiN in 131 areas) - good |
| New pad structure on PCM | 1.0584% (new pad structure on PCM) | NA |
| 107A (passivation) | 6.7987% | 5.5015% |

TABLE 3

WAT data of AK6174.1

| AK6174.1 | STD(#1–23) (average/std. deviation) | Skip SiN dep(#24) (average/std. deviation) |
|---|---|---|
| VT N20/20 | 0.732/.028 | 0.708/.002 |
| VT N20/1 | 0.630/.006 | 0.647/.004 |

Table 3 shows that if the SiN layer is not remained on the wafer, Vt uniformity is good.

Table 4 below shows the results of the $3^{rd}$ embodiment of the invention.

TABLE 4

WAT data v.s. different mask combination.

| AM0022.1 | 157A + 178A Mean/ Std. Dev | 157B + 178A Mean/ Std. Dev | --157A + 178B- Mean/ Std. Dev | 157B + 178B Mean/Std. Dev $3^{RD}$ Embodiment |
|---|---|---|---|---|
| VT N20/20p | 0.756/.034 | 0.729/.013 | 0.765/.027 | 0.730/.014 |
| VT N20/1p | 0.628/.008 | 0.621/.009 | 0.621/.007 | 0.625/.006 |

Legend—Table 4

157A—contact mask with dark scribe lane tone.

157B—contact mask with clear scribe lane tone.

Table 4 shows that if the scribe line interlevel dielectric (ILD) is removed during the contact etch (E.g., the $3^{rd}$ embodiment), the Vt uniformity is improved.

The preferred clear out ratio achieved by the $1^{st}$, $2^{nd}$ or $3^{rd}$ embodiments or any combination thereof is between 1% and 99% and more preferably between 1.05 and 20%.

Also, the $1^{st}$, $2^{nd}$ and $3^{rd}$ embodiments can be implemented singly or in any combination or all three at once.

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to an understanding of the present invention, exemplary technical data are set forth based upon current technology. Future developments in the art may call for appropriate adjustments as would be obvious to one skilled in the art.

While the invention has been particularly shown and described with reference to the preferred embodiments thereof, it will be understood by those skilled in the art that various changes in form and details may be made without departing from the spirit and scope of the invention.

What is claimed is:

1. A method of forming pad contacts and capacitors for a integrated circuit that removes a nitride layer over a polysilicon layer in a pad area to improve the VT of a transistor, comprising the steps of:

a) providing a substrate having devices formed therein; said substrate having device areas and pad areas; providing field oxide isolation regions in said substrate; providing contact regions on said substrate;

b) forming a first polysilicon layer over said substrate;

c) patterning said first polysilicon layer to define first polysilicon capacitor plates on said field oxide isolation regions; and gate electrodes over said substrate; and polysilicon pads over said pad area;

d) forming an IPO layer comprised of an insulator dielectric over said substrate covering said first polysilicon capacitor plates and gate electrodes and polysilicon pads;

e) forming a silicon nitride layer over said IPO layer;

f) forming an ILD layer over said silicon nitride layer;

g) performing a contact etch by patterning said ILD layer to define a contact opening exposing said contact region in said device area;

h) performing a capacitor/pad opening etch by etching said ILD layer to form a capacitor opening over said first polysilicon capacitor plates and to form a pad opening over said pad area;

i) performing a pad etch to remove said nitride layer and said IPO layer over said polysilicon pads in the pad areas.

2. The method of claim 1 which further includes forming a top polysilicon plate over said first polysilicon capacitor plates, and forming a Pad metal in said pad area.

3. The method of claim 1 wherein said pad area is within a testsite area in a scribe area between chip areas.

4. The method of claim 1 wherein said pad area is within a testsite pad area.

5. The method of claim 1 wherein said pad area is within a chip area in said device area.

6. The method of claim 1 which further includes: said substrate having scribe areas between said device areas; said device areas are chip areas; and said capacitor/pad opening etch removes said ILD layer from over said scribe areas; and said pad etch removes said nitride layer and said IPO layer over said scribe areas.

7. A method of forming process control monitor testsite pad contacts and capacitors for a integrated circuit that removes a silicon nitride layer over a polysilicon layer in the pads in the PCM testsite area to improve the VT of a transistor comprising the steps of:

a) providing a substrate having chip areas and scribe areas; a testsite area in said scribe areas; said testsite areas having testside pad areas; said chip areas having pad areas;

b) providing field oxide isolation regions in said substrate; providing contact regions in said chip areas in said substrate;

c) forming a first polysilicon layer over said substrate;

d) patterning said first polysilicon layer to define first polysilicon capacitor plates on said field oxide isolation regions; and gate electrodes over said substrate; and polysilicon pads over said testsite area;

e) forming an IPO layer of insulator dielectric over said substrate covering said first polysilicon capacitor plates and gate electrodes and polysilicon pads;

f) forming a silicon nitride layer over said IPO layer;

g) forming an ILD layer over said silicon nitride layer;

h) performing a contact etch by patterning said interlevel dielectric layer to define a contact opening exposing said contact area in said chip area;

i) performing a testsite pad opening etch by etching said ILD layer to form a capacitor opening over said first polysilicon capacitor plates and to form a testsite pad opening over said testsite pad area;

j) performing a pad etch to remove said nitride layer and said IPO layer over said polysilicon layer in said testsite pad area .

8. The method of claim 7 which further includes forming a top polysilicon plate over said first polysilicon capacitor plates, and forming a pad metal in said testsite pad area.

9. The method of claim 7 wherein said testsite pad opening etch removes the ILD layer over said scribe area; and the pad etch removes said nitride layer and said IPO layer over said polysilicon layer in said scribe area.

10. The method of claim 7 wherein said testsite pad opening etch removes said ILD layer over said pad areas in said chip areas; and the pad etch removes said nitride layer and said IPO layer over said polysilicon layer in said pad areas.

* * * * *

UNITED STATES PATENT AND TRADEMARK OFFICE
CERTIFICATE OF CORRECTION

PATENT NO. : 6,251,724 B1  Page 1 of 1
DATED : June 26, 2001
INVENTOR(S) : Shu-Mei Ku, Lin-June Wu It is certified that error appears in the above-identified patent and that said Letters Patent is hereby corrected as shown below:

<u>Title page,</u>
Item [54], please change the word "Ration" so that the Title reads -- METHOD TO INCREASE THE CLEAR RATIO OF CAPACITOR SILICON NITRIDE TO IMPROVE THE THRESHOLD VOLTAGE UNIFORMITY --.

Signed and Sealed this

Twelfth Day of March, 2002

Attest:

Attesting Officer

JAMES E. ROGAN
*Director of the United States Patent and Trademark Office*